(12) United States Patent
Verma et al.

(10) Patent No.: US 8,705,582 B2
(45) Date of Patent: Apr. 22, 2014

(54) DISTRIBUTED FEEDBACK LASER HAVING ENHANCED ETCH STOP FEATURES

(71) Applicant: Finisar Corporation, Sunnyvale, CA (US)

(72) Inventors: Ashish K. Verma, San Jose, CA (US); Tsurugi Sudo, San Jose, CA (US); Sumesh Mani K. Thiyagarajan, Fremont, CA (US); David Bruce Young, Oakland, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 13/932,971

(22) Filed: Jul. 1, 2013

(65) Prior Publication Data

US 2013/0287405 A1  Oct. 31, 2013

Related U.S. Application Data

(62) Division of application No. 12/902,000, filed on Oct. 11, 2010, now Pat. No. 8,477,817, which is a division of application No. 12/138,361, filed on Jun. 12, 2008, now Pat. No. 7,813,395.

(60) Provisional application No. 60/943,782, filed on Jun. 13, 2007.

(51) Int. Cl.
*H01S 5/00* (2006.01)

(52) U.S. Cl.
USPC .................. 372/43.01; 372/46.01; 372/50.11; 372/96

(58) Field of Classification Search
USPC .................................. 372/43.01, 46.01, 50.11
See application file for complete search history.

(56) References Cited

U.S. PATENT DOCUMENTS 7,197,057 B2 *  3/2007  Hwang ...................... 372/46.01
7,668,223 B2 *  2/2010  Rosso et al. .................... 372/96

\* cited by examiner

*Primary Examiner* — Dung Nguyen
(74) *Attorney, Agent, or Firm* — Maschoff Brennan

(57) ABSTRACT

In one example embodiment, a DFB laser includes a substrate; an active region positioned above the substrate; a grating layer positioned above the active region, the grating layer including a portion that serves as a primary etch stop layer; a secondary etch stop layer positioned above the grating layer; and a spacer layer interposed between the grating layer and the secondary etch stop layer.

5 Claims, 5 Drawing Sheets

DISTRIBUTED FEEDBACK LASER HAVING ENHANCED ETCH STOP FEATURES

CROSS-REFERENCE TO A RELATED APPLICATION

This application is a divisional of U.S. patent application Ser. No. 12/902,000, filed on Oct. 11, 2010, which is a divisional of U.S. patent application Ser. No. 12/138,361, filed on Jun. 12, 2008, which claims priority from U.S. Provisional Patent Application Ser. No. 60/943,782, filed Jun. 13, 2007, and entitled "DISTRIBUTED FEEDBACK LASER HAVING ENHANCED ETCH STOP FEATURES," the contents of each of which are incorporated herein by reference in their entirety.

BACKGROUND

Semiconductor lasers are currently used in a variety of technologies and applications, including communications networks. One type of semiconductor laser is a distributed feedback (DFB) laser. A DFB laser produces a stream of coherent, monochromatic light in response to stimulated photon emission from a solid state material of the DFB laser. DFB lasers are commonly used in optical transmitters, which are responsible for modulating electrical signals into optical signals for transmission via an optical communication network.

Generally, a DFB laser includes a positively or negatively doped bottom layer or substrate, and a top layer that is oppositely doped with respect to the bottom layer. An active region, bounded by confinement regions, is included between the top and bottom layers. These structures together form the laser body. A grating is included in either the top or bottom layer to assist in producing a coherent light beam output from the DFB laser. The coherent stream of light that is produced by the DFB laser can be emitted through either longitudinal end, or facet, of the laser body. DFB lasers are typically known as single mode devices as they produce light signals at one of several distinct wavelengths. Such light signals are appropriate for use in transmitting information over great distances via an optical communications network.

One common type of DFB laser is known as a ridge waveguide (RWG) DFB laser. RWG DFB lasers are commonly fabricated so as to include a mesa structure atop the grating layer. The mesa is formed by first depositing a regrowth layer atop the grating layer, then etching away the regrowth layer to define the mesa atop a portion of the grating layer.

One challenge commonly encountered during the fabrication of RWG DFB lasers involves the etching of the regrowth layer to define the mesa. During this etching step, the grating layer itself serves as an etch stop to prevent further incursion of the etchant into the laser structure. Unfortunately, due to its periodic structure, the grating layer often fails to adequately stop the etchant as desired. Specifically, the etchant can progress past the periodic portions of the grating layer and etch into the active region of the RWG DFB laser. This can cause defects in the laser structure, which in turn can compromise the performance and/or reliability of the RWG DFB laser. These etching challenges can also be encountered in non-RWG DFB lasers.

In light of the above discussion, a need therefore exists for a DFB laser design that enables the control, or even prevention, of undesired etching of the active region and/or other portions of the DFB laser. In this way, a DFB laser structure may be produced that is well suited to offer relatively more reliable performance than some typical DFB lasers.

BRIEF SUMMARY OF SOME EXAMPLE EMBODIMENTS

In general, example embodiments of the invention relate to structures and devices such as a distributed feedback (DFB) laser that includes etch stop features that may contribute to relatively more reliable operation of the DFB laser by reducing and/or preventing damage to the DFB laser.

In one example embodiment, a DFB laser includes a substrate, an active region positioned above the substrate, and a grating layer positioned above the active region. The grating layer includes a portion that serves as a primary etch stop layer. The DFB laser also includes a secondary etch stop layer located either above or below the grating layer, and a spacer layer interposed between the grating layer and the active region.

In another example embodiment, a DFB laser includes a substrate, an active region positioned above the substrate, and a grating layer positioned above the active region. The grating layer includes a portion that serves as a primary etch stop layer. The DFB laser also includes a secondary etch stop layer located below the grating layer so as to be interposed between the grating layer and the active region, and a spacer layer interposed between the secondary etch stop layer and the active region.

In yet another example embodiment, a DFB laser includes a substrate, an active region positioned above the substrate, and a grating layer positioned above the active region. The grating layer includes a portion that serves as a primary etch stop layer. The DFB laser also includes a secondary etch stop layer positioned above the grating layer, and a spacer layer interposed between the grating layer and the secondary etch stop layer.

BRIEF DESCRIPTION OF THE DRAWINGS

To further clarify certain aspects of the present invention, a more particular description of the invention will be rendered by reference to example embodiments thereof which are disclosed in the appended drawings. It is appreciated that these drawings depict only example embodiments of the invention and are therefore not to be considered limiting of its scope. Aspects of the invention will be described and explained with additional specificity and detail through the use of the accompanying drawings in which.

DETAILED DESCRIPTION OF SOME EXAMPLE EMBODIMENTS

Reference will now be made to the figures wherein like structures will be provided with like reference designations. It is understood that the drawings are diagrammatic and schematic representations of example embodiments of the invention, and are not limiting of the present invention nor are they necessarily drawn to scale.

FIGS. 1-5 depict various aspects of some example embodiments of the invention. At least some embodiments are generally directed to a distributed feedback (DFB) laser, such as a ridge waveguide (RWG) DFB laser, having etch stop features configured to reduce or prevent damage to the various components of the DFB laser, examples of which include the grating layer and active region of the DFB laser.

Note at the outset that the discussion to follow regarding embodiments of the present invention should not be construed as limiting the application to such embodiments. Indeed, devices and components apart from optical transmitters and transceiver modules that employ laser devices can also benefit from the teachings to be discussed herein.

1. Example Operating Environment

Figure 1:
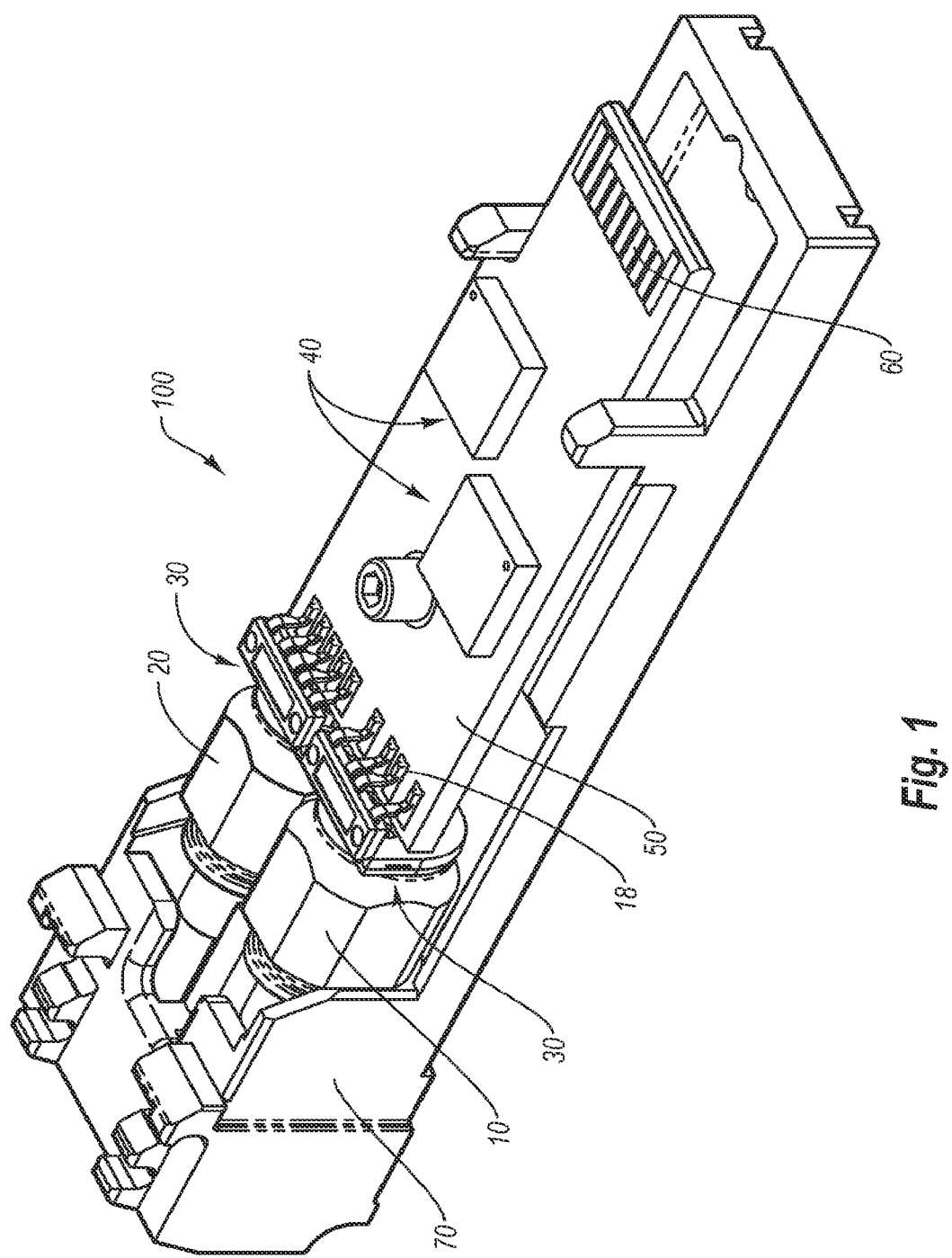
FIG. 1 is a perspective view disclosing various aspects of an example optical transceiver module.

Reference is first made to FIG. 1, which is a perspective view of an example optoelectronic module, generally designated at 100, for use in transmitting and receiving optical signals in connection with one or more other devices on a network, and communicating via electrical signals with a host device. The optoelectronic module 100 is one example of an environment in which example embodiments of the invention can be practiced, although embodiments of the invention may be practiced in a variety of other environments as well, such as transmitter and transponder modules for example, and nothing herein should be construed as limiting such environments to the example environment of FIG. 1. As disclosed in FIG. 1, the optoelectronic module 100 includes various components, including a receiver optical subassembly (ROSA) 10, a transmitter optical subassembly (TOSA) 20, electrical interfaces 30, and various electronic components 40 of a printed circuit board (PCB) 50. Further discussion of these components and their relationships is set forth below.

An edge connector 60 is located on an end of the PCB 50 to enable the optoelectronic module 100 to electrically interface with a host device (not shown). As such, the PCB 50 facilitates electrical communication between the ROSA 10/TOSA 20 and the host device. In addition, some or all of the above-mentioned components of the optoelectronic module 100 may be partially, or completely, housed within a shell 70. The shell 70 can cooperate with a cover portion (not shown) to comprise a housing for the components of the optoelectronic module 100.

The optoelectronic module 100 can be configured for optical signal transmission and/or reception at a variety of gigabit/second (G) data rates including, but not limited to, 1.25 G, 2.125 G, 2.5 G, 2.67 G, 4.25 G, 8.5 G, 10 G, 10.3 G, 10.5 G, or higher. Further, the optoelectronic module 100 can be configured for optical signal transmission and/or reception at various wavelengths including, but not limited to, 850 nm, 1310 nm, 1470 nm, 1490 nm, 1510 nm, 1530 nm, 1550 nm, 1570 nm, 1590 nm, 1610 nm, or longer wavelengths. Also, the optoelectronic module 100 can be configured to support various communication protocols including, but not limited to, Fast Ethernet, Gigabit Ethernet, 10 Gigabit Ethernet, 1×, 2×, 4×, 8×, and 10× Fibre Channel, and SONET OC-3, OC-12, OC-48, OC-192, and OC-768. Further, the optoelectronic module 100 can be configured to operate at various temperature ranges including, but not limited to, 0° C. to 70° C. and −40° C. to 85° C. In addition, the optoelectronic module 100 can be configured to assume a variety of different form factors that are substantially compliant with various transceiver and/or transponder MSAs including, but not limited to, SFF, SFP, XFP, XPAK, X2, or XENPAK. It should be noted that the foregoing aspects are intended for illustrative purposes, and the scope of the invention is not limited to any particular device configuration and/or functionality.

With continued reference to FIG. 1, and considering various components now in further detail, the ROSA 10 houses an optical receiver such as a photodiode (not shown) that is electrically coupled to one of the electrical interfaces 30. The TOSA 20 similarly houses an optical transmitter, such as a DFB laser as disclosed herein (not shown) for example, that is electrically coupled to the other electrical interface 30. The electrical interfaces 30 are used to electrically connect the ROSA 10 and the TOSA 20 to a plurality of conductive pads 18 located on the PCB 50. In this way, the ROSA 10 and TOSA 20 may communicate with the electronic components 40 of the PCB 50 and/or components, systems and devices with which the PCB 50 is, or may be, connected.

In general, the optical receiver of the ROSA 10 is configured to convert optical signals, which may be received through an optical port (not shown), into corresponding electrical signals that are relayed to the PCB 50. The optical transmitter of the TOSA 20 is configured to convert electrical signals, received through the PCB 50 from a host device (not shown), into corresponding optical signals that are transmitted through an optical port (not shown). Accordingly, the ROSA 10 serves as an optical-electronic transducer and the TOSA 20 serves as an electronic-optical transducer. The optical ports (not shown) are configured to physically and optically connect the optical transmitter of the TOSA 20 and the optical receiver of the ROSA 10 with optical fiber connectors, such as LC or SC connectors (not shown) for example, that are connected to the optical ports.

Having described aspects of a specific example environment with respect to FIG. 1, it will be understood that this specific environment is only one of countless architectures in which example embodiments of the present invention may be employed. The scope of the present invention is not intended to be limited to any particular environment.

2. Aspects of an Example Method for Providing a Secondary Etch Stop

Figure 2:
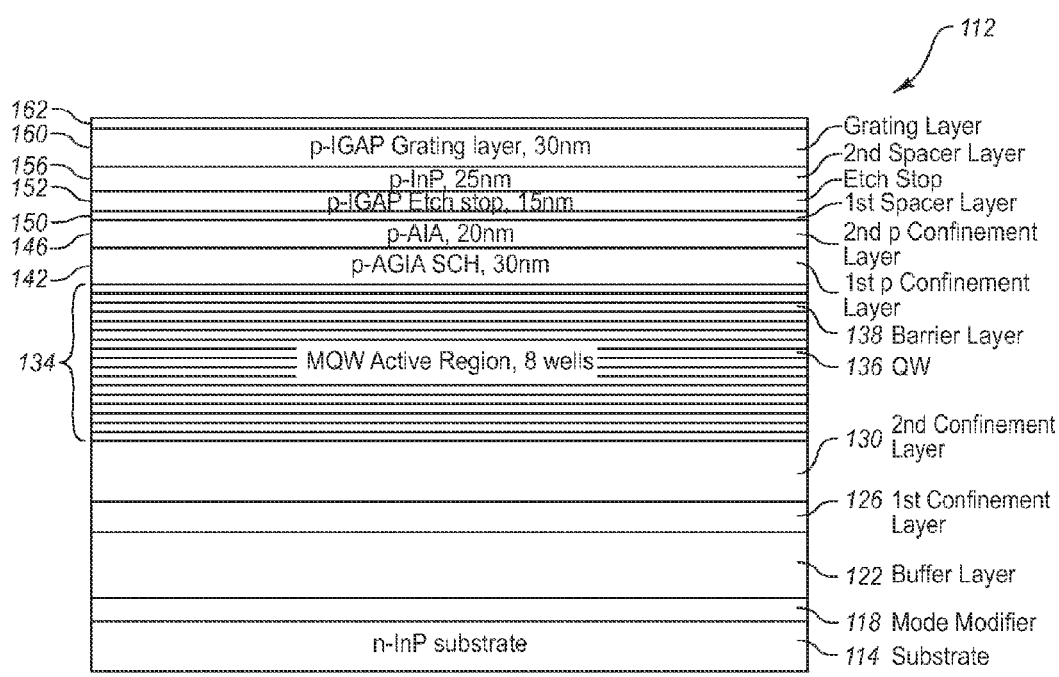
FIG. 2 is a cross sectional side view of an example epitaxial base portion of an example distributed feedback (DFB) laser such as might be employed in an optical transceiver module like that disclosed in FIG. 1.
Figure 3:
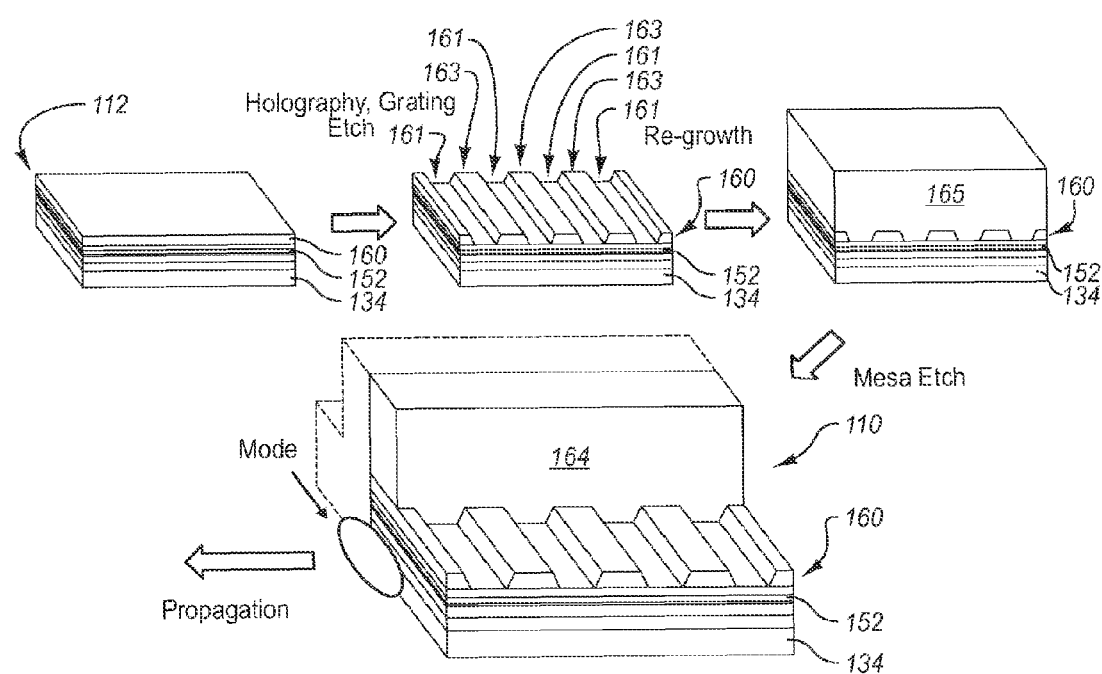
FIG. 3 is a progressive view of various example processes that may be performed on the example epitaxial base portion shown in FIG. 2.

Together with FIG. 1, reference is now made to FIGS. 2 and 3. In general, the operating environment described above, including the transceiver 100 and TOSA 20, is one example environment in which the example DFB lasers disclosed herein can be employed. In general, the example DFB lasers disclosed herein may be produced and constructed in such a way as to ensure suitable etching of a ridge waveguide and/or other portions of the DFB laser without causing unintended effects such as the etching of other portions of the DFB lasers.

By way of general overview, at least some example embodiments of a DFB laser embraced within the scope of the invention contain a cavity having an active region, and also include a distributed reflector, where the active region and distributed reflector operate in concert with each other so that the DFB laser operates in a desired wavelength range. Examples of a DFB laser may have multiple modes, including both longitudinal and transversal modes, but one of these modes will typically offer better loss and/or other characteristics relative to the other modes. This single mode typically corresponds to a single frequency at which the DFB laser operates.

The following description provides various details regarding an example 10G DFB laser configured for light emission at a wavelength of approximately 1310 nm. The following description includes both structural and functional characteristics of the example 10G DFB laser, together with certain details regarding the manufacturing processes used to build the laser. Note, however, that this description is intended for illustrative purposes only. Indeed, lasers and other semiconductor optical devices having structural and/or functional aspects that differ from the example lasers of this disclosure can also benefit from the principles disclosed herein. It is also appreciated that additional or alternative layers, layer thicknesses, layer compositions and/or layer structures can be incorporated into the example DFB lasers disclosed herein, and/or may be used to define yet other DFB laser structures that while not specifically set forth herein are nonetheless embraced within the scope of the invention. The following discussion is therefore not intended to limit the scope of the present invention in any way.

a. Base Epitaxial Layers

FIG. 2 discloses layers of an example base epitaxial portion 112 of a 10 G DFB laser 110 (see FIG. 3) at a stage prior to etching of the grating layers. It should be noted that the thickness, composition, structure, and/or location of one, some, or all layers of the devices disclosed herein may be varied to suit the requirements of a particular application. In this particular example, the base epitaxial portion 112 of the DFB laser 110 is grown on a substrate 114 that may comprise n-doped Indium Phosphide substrate (n-InP substrate), though other substrate 114 materials may additionally or alternatively be employed.

A "mode modifier" layer 118 is grown on top of the substrate 114 using, for example, n-doped Indium Gallium Arsenide Phosphide (InGaAsP) at an approximate thickness of about 120 nm. A mode modifier layer of this example composition may be referred to herein as an n-IGAP Mode Modifier. The mode modifier layer 118 functions to reduce the power of second-order transverse modes that may propagate within the DFB laser 110. In particular, the mode modifier layer 118 effectively increases the loss associated with these second-order transverse modes and couples the modes away from an active region 134, discussed below, of the DFB laser 110. This suppression of second-order transverse modes can allow for wider mesa widths on the DFB laser 110 because the DFB laser 110 is relatively less sensitive to these transverse modes.

A buffer layer 122, which may comprise n-doped Indium Phosphide (n-InP) is grown on top of the mode modifier layer 118. The buffer layer 122, in this particular example, may be approximately 1.4 µm thick and provides a surface on which the n-layers of the DFB laser 110 are grown. Of course, buffer layers of other thicknesses, structures and/or compositions may alternatively be employed.

With continued reference to FIG. 2, the base epitaxial portion 112 of the example DFB laser 110 may further include a first current confinement layer 126 which, in this particular example, comprises n-doped Aluminum Indium Arsenide (n-AIA) grown at a thickness of about 20 nm on the buffer layer 122 and doped with silicon. A second current confinement layer 130 comprising, for example, n-doped Aluminum Gallium Indium Arsenide (n-AGIA SCH) may also be provided and in this example is grown at a thickness of about 30 nm on the first current confinement layer 126 and is also doped with silicon. Both of the current confinement layers 126 and 130 operate to contain electrons within an active region 134, discussed below, so that photons are produced. The second current confinement layer 130 is graded to improve the confinement characteristics of the second current confinement layer 130. The thicknesses of the current confinement layers 126 and 130 may be relatively thin in order to optimize the thermal performance of the DFB laser 110.

An active region 134 is grown on the current confinement layers 126 and 130. In some example embodiments, the active region 134 is designed to be a multi-quantum well (MQW) active region. For example, the active region 134 may have about eight quantum wells 136, each having an associated wavelength of approximately 1295 nm, though the number and/or associated wavelengths of the DFB laser 110 quantum wells may vary from one embodiment to another. Quantum barriers 138 interleaved between the quantum wells 136 may have corresponding wavelengths of approximately 980 nm. In this particular example, the depth and width of the quantum wells 136 are designed to produce approximately 1310 nm photons, although other quantum well configurations may be employed to attain other emission wavelengths. In at least some embodiments, the active region 134 is designed to be "strain compensated," which means that the interleaved quantum barriers 138 are designed to have opposing strain characteristics relative to the strain characteristics of the quantum wells 136. As a result, the strain generated from the interleaved quantum barriers 138 at least partially cancels the strain generated by the quantum wells 136 or, in an alternative case, the strain generated by the quantum wells 136 at least partially cancels the strain generated from the interleaved quantum barriers 138, such that a reduction in the overall strain on the active region 134 is achieved. The quantum well design may be intentionally manufactured so that a complete cancellation of strain in the active region 134 does not occur, but a small amount of strain remains for performance considerations.

In addition, the layers of the active region 134 may be intentionally doped with Zn, or other suitable material(s), to maintain a low-level p-type doping. This is done to help assure that the p-n junction of the DFB laser 110 always occurs in the same place, and is not made variable by unpredictable dopant diffusion processes.

With continued reference to the example of FIG. 2, the base epitaxial portion 112 of the example DFB laser 110 may further include a first confinement layer 142. The first confinement layer 142 may comprise, for example, a p-doped Aluminum Gallium Indium Arsenide separately confined heterostructure (p-AGIA SCH). The first confinement layer 142 is grown on the active region 134 at a thickness of about 30 nm and doped with zinc. A second confinement layer 146 which may comprise, for example, p-doped Aluminum Indium Arsenide (p-AIA) is grown at a thickness of about 20 nm on the first p-confinement layer 142 and also doped with zinc. Both of the confinement layers 142 and 146 effectively maintain holes within the active region 134 so that photons are produced when carriers enter the active region 134. The first confinement layer 142 is graded to improve the confinement characteristics of the first confinement layer 142. The thicknesses of the confinement layers 142 and 146 may be relatively thin in order to optimize the speed and thermal performance of the DFB laser 110.

In the example of FIG. 2, a first spacer layer 150 may be located above the p-confinement layers 142 and 146. In this example, the first spacer layer 150 is made of Indium Phosphide and is approximately 5 nm in thickness. In at least some embodiments, the relative thinness of the first spacer layer 150 may improve the coupling efficiency of the grating and the speed of the DFB laser 110. In particular, the first spacer layer 150 may be employed to effectively control the degree to which lateral current spreading occurs between the bottom of the mesa 164 (see FIG. 4) and the active region 134.

In the example embodiment of FIG. 2, various "aboveactive" grating layers are located above the first spacer layer 150. An etch stop layer 152, which may comprise p-doped Indium Gallium Arsenide Phosphide (InGaAsP) (p-IGAP) and may have a thickness of about 15 nm, is grown on the spacer layer 150. The etch stop layer 152 is provided for controlling the mesa etch, as will be discussed further below.

A second spacer layer 156 is provided in this example to separate the etch stop layer 152 and a grating layer 160, described below. In one example embodiment, a grating etch procedure is timed to stop the etching within the second spacer layer 156. The second spacer layer 156 is, in this example, made of p-doped Indium Phosphide (p-InP) and has a thickness of about 25 nm. Embodiments where a portion of a layer, such as the grating layer 160, implements an etch stop function, and where a further etch stop layer, such as etch stop layer 152, is provided, may be referred to as including a primary etch stop layer and a secondary etch stop layer.

The grating layer 160 is grown on the second spacer layer 156 and, in this example is made of p-doped Indium Gallium Arsenide Phosphide (InGaAsP) (p-IGAP) and has a thickness of about 30 nm. The grating layer 160 is "above active" (as compared to other possible designs in which the grating layer may be located below the active region 134). Laser holography, wet etching, and subsequent InP regrowth, as explained further below, are used to create a uniform grating in the grating layer 160, including alternating layers of high index IGAP and low index InP down a length of the laser cavity. In general, and as disclosed in further detail elsewhere herein, the grating layer 160 may be arranged so as to be buried within the base epitaxial portion 112 of the example DFB laser 110 and substantially unexposed to air during etch processes that occur after the deposition of the grating layer 160. This result may be achieved at least in part through the use of an etch stop layer positioned above the grating layer 160. In at least some embodiments, the grating layer 160 is perforated and has a composition that is about 50% quaternary materials. One example of such an alternative embodiment is discussed in further detail below in connection with FIG. 5.

The laser cavity of the DFB laser 110 can support two degenerate longitudinal grating modes because the grating formed in the grating layer 160 is uniform, as opposed to a quarter-wave shifted design for example. Selection of one or the other of these two modes is dependent upon the phase associated with the facet cleave, which is dependent upon the location of the cleave with respect to the grating period. Because the location of the cleave may not be controlled with sufficient precision, all phase possibilities may be represented by any ensemble of devices of this design. As a result, there may be a finite percentage of laser parts for which both grating modes are equally supported, resulting in inadequate single-mode behavior. These lasers are discarded.

Finally, a top layer 162 is provided above the grating layer 160. As discussed in further detail below, the regrowth of other layers may be performed on the top layer 162. In some embodiments, the top layer 162 is a relatively thin layer of Indium Phosphide.

b. Grating Fabrication and Regrowth

FIG. 3 discloses various grating fabrication and subsequent regrowth stages employed in forming portions of the structure of the example DFB laser 110. In particular, FIG. 3 shows a side view of a portion of the base epitaxial structure 112 of FIG. 2, together with subsequent grating fabrication and regrowth steps in forming the DFB laser 110. As described above and by way of brief overview, a wet etch or other suitable process is performed to etch periodic gaps 161 within the grating layer 160, as disclosed in FIG. 3. After the etch is completed and grating regions 163 are created, a relatively thick layer 165, which may comprise Indium Phosphide for example, is grown as a regrowth on the etched base epitaxial structure in order to fill the gaps with low-index InP and also to form the mesa 164, also disclosed in FIG. 3.

As mentioned above, the Indium Phosphide regrowth is used to create a mesa 164 on the epitaxial base 112 that provides current confinement and also functions as a waveguide, by way of lateral optical confinement. The mesa 164 is also referred to herein as a "ridge waveguide" (RWG). Photoresist, or other suitable process, is used to etch the mesa 164 of the DFB laser 110 out of the regrowth layer 165. Dry and/or wet etching can be used in creating the mesa 164.

After the etching process resulting in the structure of the DFB laser 110 depicted in the bottom drawing of FIG. 3 is complete, a dielectric layer (not shown) is placed on the structure depicted in the bottom drawing of FIG. 3. In some example embodiments, a triple stack of Silicon Nitride, Silicon Dioxide, and Silicon Nitride is used to form the dielectric layer. This dielectric layer may be relatively thick in order to reduce parasitic capacitance, and thereby improve speed, and is used to confine the current within the mesa. In other embodiments, a single layer of materials such as Silicon Nitride or Silicon Oxide, for example, can be employed for the dielectric layer.

Thereafter, the portion of the dielectric layer atop the mesa 164 is removed to allow an electrical contact layer (not shown) to be placed atop the mesa 164. The electrical contact layer is made by depositing metal, such as Indium Gallium Arsenide, at the top of the mesa 164. This electrical contact layer may be both a non-alloy contact and a low penetration contact.

Thereafter, a metallic layer (not shown) is placed on the electrical contact layer to enable electrical current to be provided to the DFB laser 110. In one example embodiment, the metallic layer is made of three sub-layers, such as titanium, platinum and gold for example. In this example, the titanium sub-layer is placed directly on the electrical contact layer, then the platinum sub-layer and gold sub-layer are applied. This metallic layer provides sufficient conductivity to the Indium Gallium Arsenide contact layer so that current can be provided to the laser structure.

Bottom electrical contacts (not shown) are generated by thinning the substrate 114 (as shown in FIG. 2) and placing an n-type metallic layer on the bottom of the DFB laser 110.

When the layer structure of the DFB lasers 110 has been completed, the DFB lasers 110 are removed from a wafer by cleaving and breaking the wafer both horizontally and laterally to separate each DFB laser 110. After this process, anti-reflective (AR) and high-reflective (HR) coating processes are performed on each DFB laser 110 to encapsulate the active region 134 of the DFB laser 110 and provide the requisite reflectivity characteristics of the laser cavity. The reflectivity characteristics define the optical power emitted from the back of the laser and the front of the DFB laser 110. In uniform grating designs, a majority of the optical power is emitted from the front of the laser, which can be optically coupled with an optical fiber for propagation of an optical signal, for example. A minority of the optical power is emitted from the back of the laser, which can be optically coupled with a photodetector, such as a monitor photodiode for example, for monitoring laser performance.

In one embodiment, the AR and HR coatings are made of layers of Silicon Oxide and Silicon. The reflectivity of the AR coating may, in some embodiments, be less than about 0.5%, while the reflectivity of the HR coating may, in some embodiments, be designed to be higher than about 90%. Once the coating process is complete, a testing process is performed in which the power characteristics and optical spectrum of the DFB laser 110 are tested.

The DFB laser 110, and an optional photodetector (not shown), may be packaged into an optical sub-assembly, such as the TOSA 20 shown in FIG. 1, which is subsequently packaged into an optical module, such as the transceiver 100 of FIG. 1, along with driver and control integrated circuits.

c. Etch Stop Protection

Figure 4:
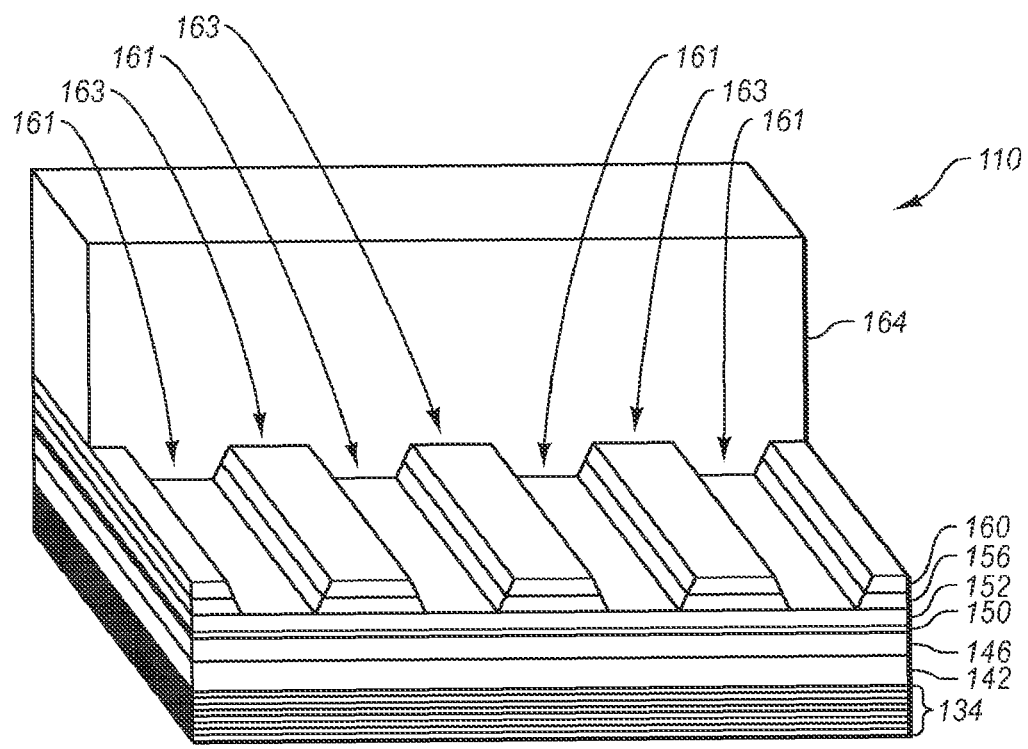
FIG. 4 is a perspective view of a portion of a ridge waveguide (RWG) DFB laser similar to that disclosed in FIG. 3.

Reference is now made to FIG. 4, which discloses additional details regarding the example DFB laser 110 discussed above in connection with FIG. 3. As disclosed in FIG. 4, the DFB laser 110 includes a mesa 164 atop the grating layer 160. As disclosed in FIG. 4, the grating layer 160 and at least a portion of the depth of the second spacer layer 156 have been etched in a periodic manner. In some instances, the second spacer layer 156 may be etched down to the etch stop layer 152. The first spacer layer 150 is deposited below the etch stop layer 152 so as to be interposed between the etch stop layer 152 and the second confinement layer 146.

In one example embodiment, the etch stop layer 152 is positioned and configured to prevent the etchant, that is used to define the mesa 164, from proceeding past the etch stop layer 152. As such, the etch stop layer 152 protects the quantum wells 136 (see FIG. 2) of the active region 134, and/or other designated portions of the DFB laser 110, from etching. The utility of the etch stop layer 152 in stopping progress of the etchant is especially useful in the periodic gaps 161 defined between the periodic gratings 163 of the grating layer 160, where only portions of the second spacer layer 156 would otherwise be present to stop or substantially contain the progress of the etchant.

In greater detail, during mesa etching, the etchant may be stopped in the second spacer layer 156 after defining the periodic grating layer 160. Should, for some reason, the etchant etch through the second spacer layer 156, however, the etch stop layer 152 is positioned to substantially prevent further advancement of the etchant, thereby substantially preserving the integrity of the DFB laser 110, specifically, substantially preserving the quantum wells 136 (see FIG. 2) of the active region 134 from damage from the etchant.

As mentioned above, in one example embodiment, the etch stop layer 152 is a p-layer composed of Indium, Gallium, Arsenide, and Phosphide and has a thickness of about 15 nm, while the first spacer layer 150, located below the etch stop layer 152, is a p-layer composed of Indium Phosphide and has a thickness of about 5 nm. Advantageously, the positioning and effect of the etch stop layer 152 enable the implementation of a relatively thin first spacer layer 150, since the etch stop layer 152 may serve as a secondary etch stop with regard to the second spacer layer 156. That is, any etchant not stopped before passing through the second spacer layer 156 would be substantially contained by the etch stop layer 152, thereby obviating the need to provide a relatively thick first spacer layer 150. The relative thinness of the first spacer layer 150, in turn, may improve the coupling efficiency of the grating layer 160 and also improve the speed of the DFB laser 110, while also reducing the overall thickness of the DFB laser 110. Also, the first spacer layer 150 may help to effectively control the degree to which lateral current spreading occurs between the bottom of the mesa and the active region 134. Note that the principles of the present invention can be preserved while altering the thickness and particular compositions of the layers disclosed herein. The same is likewise true with respect to the positioning of various layers. For example, in one alternative embodiment disclosed in further detail below, a secondary etch stop layer may be positioned above the grating layer 160, in the regrowth portion, rather than being positioned below the grating layer 160.

Figure 5:
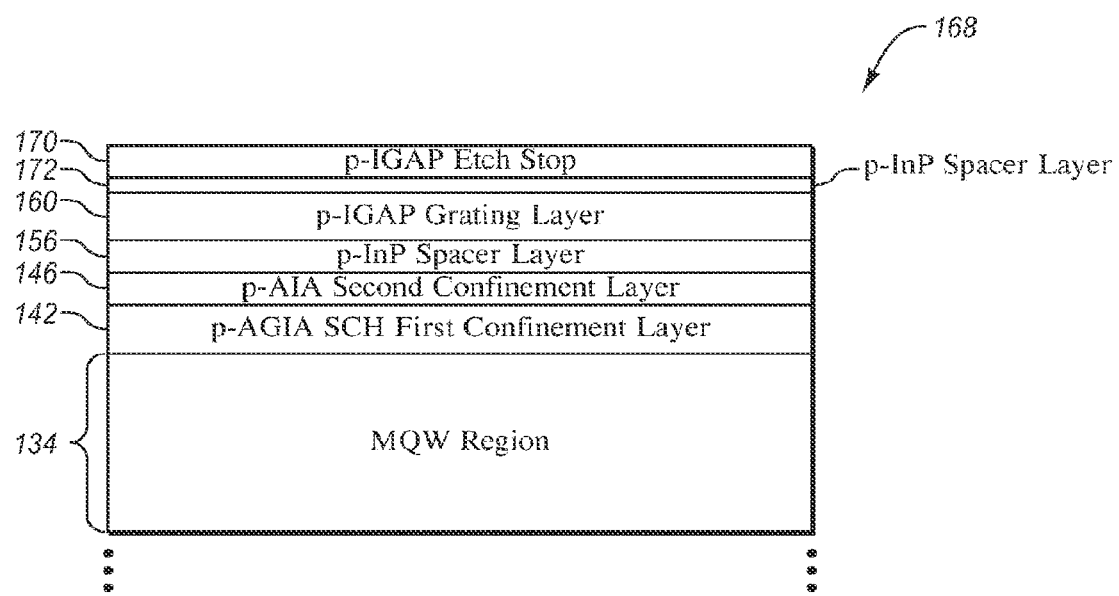
FIG. 5 is a cross sectional side view of another example epitaxial base portion of another example DFB laser.

Reference is now made to FIG. 5, wherein another example epitaxial base portion 168 of another example DFB laser is disclosed. In contrast to the epitaxial base portion 112 of FIG. 2, the epitaxial base portion 168 of FIG. 5 includes an etch stop layer 170 disposed atop the grating layer 160, and the epitaxial base portion 168 further includes an InP spacer layer 172 interposed between the etch stop layer 170 and the grating layer 160. Positioning the etch stop layer 170 above the grating layer 160 as disclosed in FIG. 5 protects the quantum wells 136 (see FIG. 2) of the active region 134 from the etching procedure used to define the mesa 164, as was the case in the embodiment disclosed in FIG. 4. The epitaxial base portion 168 of FIG. 5 also protects the periodic grating of the grating layer 160 by substantially preventing the occurrence of lateral etching damage in the second spacer layer 156 underlying the grating layer 160, and thereby preserving the integrity of the grating layer 160. In some example embodiments, the etch stop layer 170 may have a similar composition as the etch stop layer 152 disclosed herein.

In one example embodiment, the etch stop layer 170 is formed as a separate process step, such as a deposition step, which is performed before the regrowth process used to define the mesa 164 (FIG. 4) is commenced. In another example embodiment, formation of the etch stop layer 170 can be incorporated into a single regrowth process that also defines the regrowth layer 165 (FIG. 3). In yet another example embodiment, the etch stop layer 170 (FIG. 5) can be included in the DFB laser 110 (see FIG. 3) together with the etch stop layer 152 (FIG. 4) so as to provide additional etch protection. Alternatively, a secondary etch stop layer can be positioned amongst other layers of the DFB laser 110.

Example embodiments of the present invention, which provide a secondary etch stop layer—in addition to the inherent etch stop capabilities of the grating layer—in the epitaxial structure of a DFB laser provide protection to sensitive portions of the laser structure, including, for example, a multi-quantum well active region. This protection may enable a reduction in the relative thickness of one or more spacer layers beneath the grating layer, thereby reducing the overall size of the DFB laser. Note that the thickness of the secondary etch stop layer can be modified according to etch protection need and that the secondary etch stop layer can be used with lasers having a variety of different layer compositions and configurations. For instance, the secondary etch stop layer can be employed in both RWG and non-RWG DFB lasers. The secondary etch stop layer may also be employed in DFB lasers having a variety of wavelength and speed characteristics.

Note that in some example embodiments, the secondary etch stop layer may be composed of other suitable materials, such as aluminum alloys, examples of which include AlGaInAs or AlGaAs, depending on the etch chemistry used to define the mesa. Note also that the thickness of the secondary etch stop layer depends upon the preferential selectivity of the etchant to the mesa material (InP in this case), with respect to the etch stop material.

The example embodiments disclosed herein may be embodied in other specific forms. The example embodiments disclosed herein are to be considered in all respects only as illustrative and not restrictive.

What is claimed is:

1. A distributed feedback (DFB) laser, comprising:
    a substrate;
    an active region positioned above the substrate;
    a grating layer positioned above the active region, the grating layer including a portion that serves as a primary etch stop layer;
    a secondary etch stop layer positioned above the grating layer; and a spacer layer interposed between the grating layer and the secondary etch stop layer.

2. The DFB laser as recited in claim 1, wherein:
the secondary etch stop layer comprises indium gallium arsenide phosphide:
the spacer layer comprises indium phosphide; and
the grating layer comprises indium gallium arsenide phosphide.

3. The DFB laser as recited in claim 1, wherein a thickness of the spacer layer is at least partly based upon the presence of the secondary etch stop layer.

4. A TOSA comprising:
a housing; and
the DFB laser as recited in claim 1 positioned within the housing.

5. An optical transceiver module comprising:
the TOSA as recited in claim 4;
a ROSA; and
a PCB in electrical communication with the TOSA and the ROSA.

* * * * *